United States Patent [19]

Prevot et al.

[11] Patent Number: 4,736,161
[45] Date of Patent: Apr. 5, 1988

[54] HIGH FREQUENCY ANTENNA FOR A NUCLEAR MAGNETIC RESONANCE MEASURING APPARATUS

[75] Inventors: Claude Prevot, Antony; Robert Encellaz, Beynes; René Chesneau, Sceaux, all of France

[73] Assignee: Thomson-CGR, Paris, France

[21] Appl. No.: 870,750

[22] Filed: Jun. 4, 1986

[30] Foreign Application Priority Data

Jun. 7, 1985 [FR] France ............................ 85 08642

[51] Int. Cl.⁴ .......................................... G01R 33/20
[52] U.S. Cl. ................................... 324/318; 324/313
[58] Field of Search ............... 324/318, 309, 313, 322, 324/316; 343/841

[56] References Cited

U.S. PATENT DOCUMENTS

| | | | |
|---|---|---|---|
| 4,536,714 | 8/1985 | Clark | 343/841 |
| 4,620,155 | 10/1986 | Edelstein | 324/322 |
| 4,652,824 | 3/1987 | Oppelt | 324/318 |

FOREIGN PATENT DOCUMENTS

| | | |
|---|---|---|
| 0071896 | 2/1983 | European Pat. Off. . |
| 0073375 | 3/1983 | European Pat. Off. . |
| 0084946 | 8/1983 | European Pat. Off. . |
| 0107238 | 5/1984 | European Pat. Off. . |
| 0132338 | 1/1985 | European Pat. Off. . |
| 0141383 | 5/1985 | European Pat. Off. . |

*Primary Examiner*—Stewart J. Levy
*Assistant Examiner*—Louis M. Arana
*Attorney, Agent, or Firm*—Oblon, Fisher, Spivak, McClelland & Maier

[57] ABSTRACT

A high frequency antenna is provided for an apparatus measuring nuclear magnetic resonance, of the type whose radiating means comprise conductors forming high frequency resonators with a metal casing. They are frequency tuned by adjustment capacitors situated at their ends. For simplifying the frequency tuning of two paired resonators through which flow currents in phase opposition, it is proposed to join together galvanically two ends of these two resonators by a high frequency line section whose length is substantially equal to half the wave length of the energization wave to be emitted. The frequency matching of the antenna may be made by adjusting simultaneously all the adjustment capacitors by means of a common control knob. Coupling of the energization energy is provided magnetically in the middle of this high frequency line section.

18 Claims, 2 Drawing Sheets

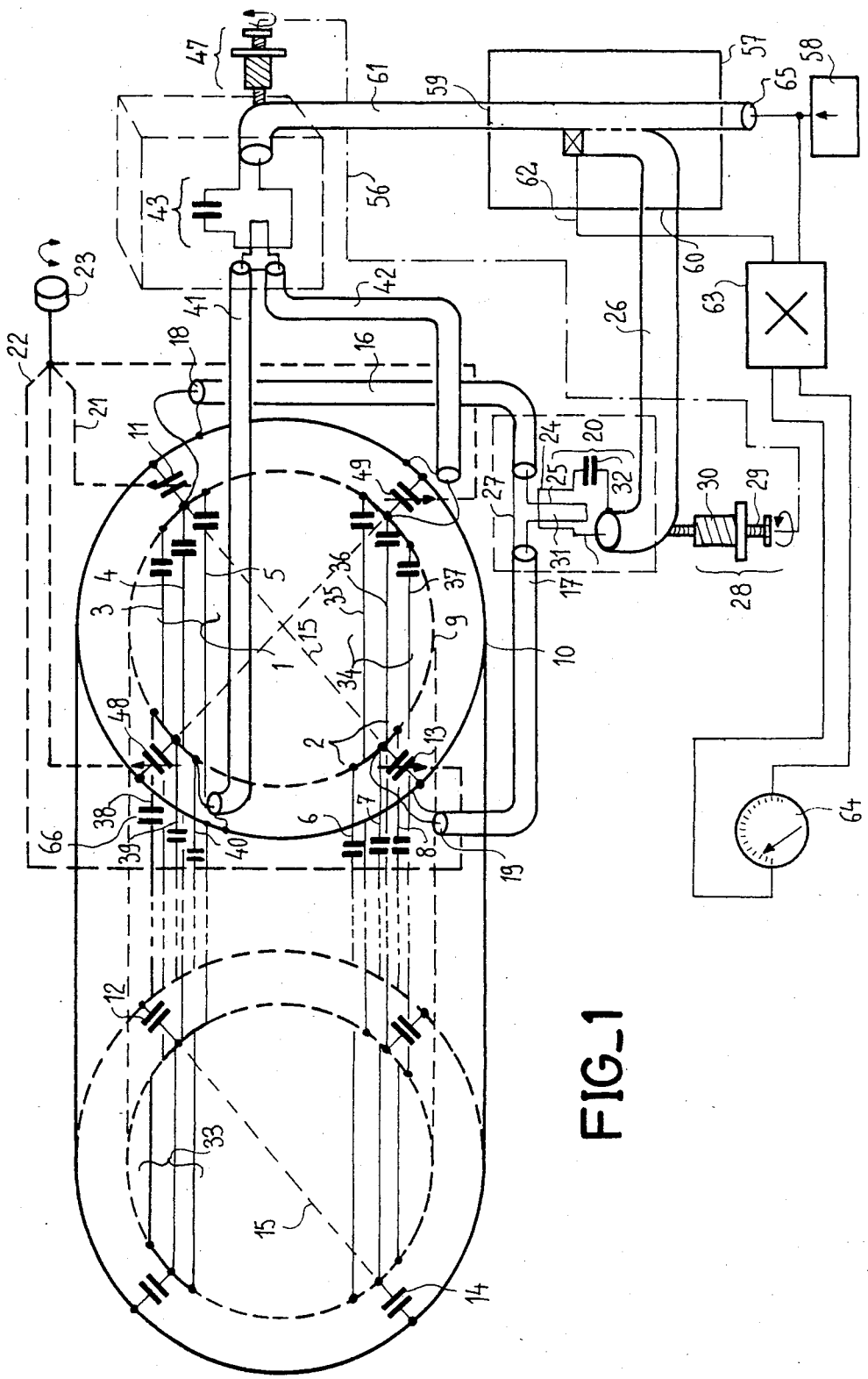
FIG_1

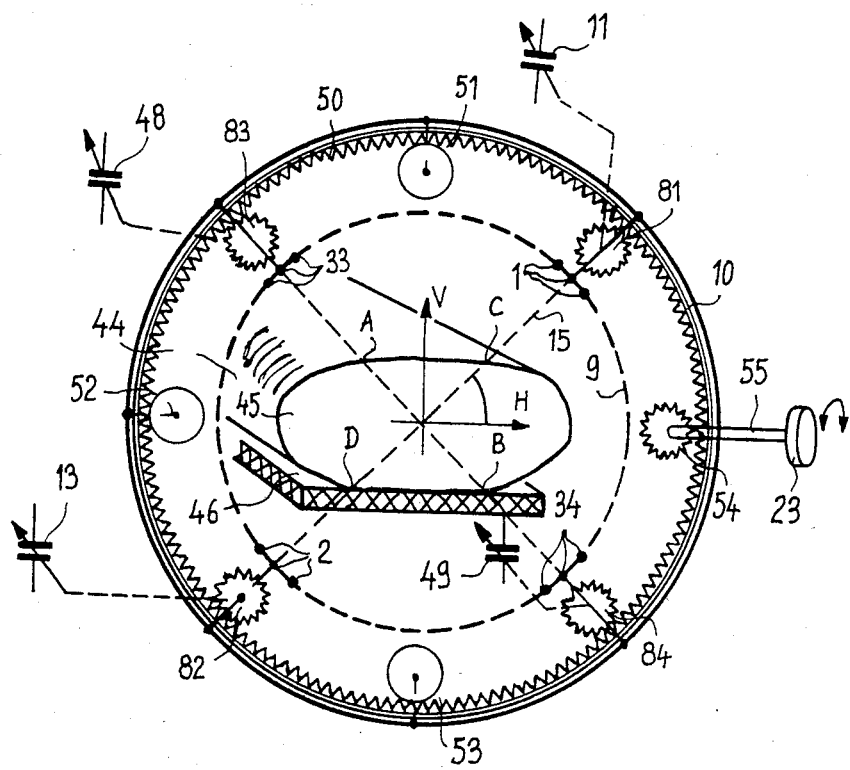
FIG_2

HIGH FREQUENCY ANTENNA FOR A NUCLEAR MAGNETIC RESONANCE MEASURING APPARATUS

BACKGROUND OF THE INVENTION

The present invention relates to a high frequency antenna for an apparatus measuring the nuclear magnetic resonance. It finds its application more particularly in the medical field where the measurement of the nuclear magnetic resonance is used for forming tomograms.

1. Field of the Invention

An apparatus for measuring the magnetic resonance of the nuclei of a body comprises means for subjecting this body to an intense continuous magnetic field. It also generally comprises means for applying continuous magnetic field gradients along three axes for frequency discriminating different sections of the body. With this continuous or pseudo-continuous magnetic induction established, the body to be examined is subjected to a high frequency alternating magnetic energization. The frequency of this energization is related to the intensity of the continuous magnetic field and to the gyromagnetic ratio of the nuclei of the body. It is in these conditions of concordance that the phenomenon of nuclear magnetic resonance occurs. Then the energization is stopped and the de-energization wave produced by the nuclei when they return to their state of equilibrium is measured.

2. Description of the Prior Art

The sensor which receives the de-energization wave is the same device as the one which serves for applying the high frequency energization: it is called high frequency antenna. A duplexer allows the energization to be oriented correctly towards the antenna, and the de-energization wave towards the detection means. Different types of antennae are known. A particular pattern of antenna has been developed, saddle antenna, whose advantage is that it is readily adapted to the study of stretched out bodies such for example as human bodies. In these antennae, the radiating element comprises turns through which currents flow. Another type of antennae comprises conductors disposed over a fictitious cylinder, parallel to and externally of the body to be examined. These conductors are connected at their ends by capacitors to a conducting metal screen which envelops the fictitious cylinder. The capacitors are tuned so that the conductors form, with the screen resonating line elements resonating at the frequency of the high frequency electric signal which is applied thereto. An example of such a structure is described in the European patent application No. 0 073 375 filed on the Aug. 12, 1982. The conductors are there arranged in pairs. The conductors of one pair are diametrically opposite each other on the fictitious cylinder. At each half wave of the energization signal, the current which flows in a conductor of one pair is opposite in direction to that which flows in the paired conductor. For reasons of homogeneity, each conductor may be replaced by a group of adjacent conductors connected together at their ends.

An antenna element comprises then two conducting half elements: each half element corresponds, in this embodiment, to a single conductor or to a group of adjacent conductors. In order to improve the gain of the antenna, and consequently the signal to noise ratio during detection of the de-energization wave, it is necessary for the intrinsic resonance frequency of each of these half elements to be the same. So that the half elements have the same resonance frequency it is necessary to adjust their tuning capacitors concurrently: two half elements in fact behave with respect to each other like two coupled resonators. Taking into account the energization frequencies used (a few mega hertz) and the tolerable divergences between the over voltage frequencies of each of the half elements and the energization frequencies, these adjustments are delicate. The problem is all the more complicated since an antenna generally comprises more than one antenna element. It often comprises two. In this latter case, it is then necessary to adjust four capacitors.

Despite everything, this difficulty could be overcome if it was sufficient to adjust the capacitors once and for all in the factories. An additional drawback is due to the fact that the bodies examined are not comparable with each other. They induce in the half elements of each antenna element reactive impedances which differ from one case to another. The antennae are then out of tune: for each body (for each patient) the adjustment must be made again. This latter adjustment is not carried out in the factory. In addition, in most cases, the frequency tuning of all the resonators formed by the conducting half element is not even undertaken. The operator makes shift with degraded operation prejudicial to the quality of the tomogram images produced.

Moreover, it appears necessary to impedance match the antenna with the supply and reception circuits to which it is connected. This requirement goes hand in hand with the need to adjust the power transmitter to the antenna by these supply circuits. The lack of matching present at transmission is also present at reception. Now, as has already been mentioned, the bodies to be examined (the patients) do not ressemble each other. From one situation to another the impedance presented by these bodies to the hiqh frequency magnetic energization is different. In short, the load presented by the antenna, or the energy consumption varies. This is why it is advisable to adjust the power and match the impedance.

In short, if the load presented by the body to be examined, and seen through the antenna from the supply means, is $z=a+jb$, it may be considered that frequency tuning is obtained when b is o and that power matching is obtained when a is equal to the internal resistance of the supply-reception means. It is because all these adjustments are difficult, considering the complexity of an antenna system, that they are not even undertaken.

SUMMARY OF THE INVENTION

The present invention overcomes these disadvantages by providing an antenna which is equipped with two adjustment means: one for frequency tuning, one for power tuning. The simplicity of the adjustments is achieved principally by a device coupling two antenna half elements of an antenna element together.

The invention relates to a high frequency antenna for an apparatus measuring the nuclear magnetic resonance of the nuclei of a body, comprising at least one antenna element formed of two conducting half elements, extending opposite each other along generatrices of a fictitious cylinder and each of which form, with adjustable tuning capacitors and a metal cylindrical casing, means for radiating a high frequency magnetic field inside the fictitious cylinder when they are fed in phase opposition to each other by a high frequency electric signal, further comprising a high frequency line section, whose length is substantially equal to half the wave length of the high frequency wave corresponding to the signal, and which is connected by its ends to each of the conducting half elements for tuning the radiating means in frequency.

BRIEF DESCRIPTION OF THE DRAWINGS

The invention will be better understood from the following description with reference to the accompanying Figures in which the same references designate the same elements. They are given by way of non limitative indication of the invention. The Figures show:

FIG. 1, a high frequency antenna in accordance with the invention;

FIG. 2, a mechanical feature of means for adjusting the antenna.

DESCRIPTION OF THE PREFERRED EMBODIMENT

FIG. 1 shows in perspective a high frequency antenna in conformity with the invention. It is intended to be introduced in an apparatus measuring the nuclear magnetic resonance of the nuclei of a body. The body studied is rather elongate and must be placed inside this antenna. Such an apparatus comprises, as is known, means not shown for producing an intense magnetic field in a region of the elongate shaped space. It comprises, not shown either, magnetic field gradient means for superimposing on this intense magnetic field fields oriented along three orthogonal axes. One of these axes is colinear with the elongate shape. The antenna shown comprises at least one antenna element 1-2. This antenna element comprises two conducting semi elements, respectively the semi elements 1 and 2. Each semi element may comprise, depending on the embodiment, one or more conductors, respectively 3 to 5 and 6 to 8, elongate with respect to each other along generatrices of a fictitious cylinder 9 shown by broken lines. The conductors of one semi element are electrically connected together at their ends. A cylindrical metal casing 10 forms a screen so that the high frequency field radiated by the conductors is confined inside. This high frequency field cannot then disturb the operation of the means for producing the intense magnetic field and the magnetic field gradients. Casing 10 may further serve for holding the conductors of the semi elements in position. The conductors form with the casing 10 and tuning capacitors, respectively 11-12 and 13-14, means for radiating a high frequency magnetic field. This high frequency field is oscillating and is perpendicular to a plane section 15 which contains the semi elements, when these semi elements are fed in phase opposition with respect to each other.

The previous frequency tuning was obtained in the state of the art by adjusting adjustable capacitors 11 and 13 so as to cause each radiating means to resonate at the same frequency corresponding to the frequency of the energization signal applied to the conductors. This tuning is now obtained in the invention by connecting together the conductors of the semi element of an antenna element by a high frequency line section 16-17. The length of this section is substantially equal to half of the wave length (in the technology of this high frequency line) of the high frequency electromagnetic wave applied. The result is that all the problems associated with coupled resonators are overcome for there is now only a single resonating system. In particular, the resonance frequency of two antenna semi elements thus paired becomes the same. The result is that the gain of the antenna elements formed is always maximum.

The high frequency line 16-17, in the preferred embodiment, comprises a coaxial cable. At its ends 18 and 19, it is connected to the ends of the conductors of the semi elements 1 and 2 in the following way. At each end, the braid of the coaxial cable is galvanically coupled to casing 10 whereas the core of the coaxial cable is galvanically coupled to the conductor. In other words, the original tuning capacitors 11 and 13 are now connected between the core and the braid of this cable. This mounting offers further multiple advantages. In particular the power may be supplied magnetically with magnetic coupling loops. In fact, the galvanic couplings of the ends 18 and 19 of the high frequency line sections 16-17 take place at positions of the semi elements where there is voltage. Current antinodes are provided so that they are situated substantially towards the middle of the conductors so as to produce in the middle of the antenna the highest magnetic field. The result is that in the middle of sections 16 and 17 there also exists a current antinode. This current antinode is used for providing a magnetic coupling 20 for supplying the radiating means with power. As will be seen, further on, this magnetic coupling allows the transmitted power matching to be achieved and that is to say the signal to noise ratio to be improved at reception.

Furthermore, because of the length of the semi sections 16 and 17, of substantially equal lengths ($\lambda/4$), the coupling means 20 may be substantially distant from the antenna itself. At working frequencies, for example of the order of 30 MHz, a quarter wave length (in a vacuum) is equal to about 2m50. In addition, while offering the advantage of supplying the semi elements 1 and 2 with power in phase opposition, as well as frequency tuning of the corresponding resonators, the high frequency line section 16-17 allows the antenna to be moved away from the power coupling means 20. In other words, an operator who adjusts these coupling means cannot disturb the adjustment of the anntena by the movement of his hand for example. With motorized adjustment, the position of a motor may be distant from the active region of the antenna.

With the frequency tuning of the two resonators 1 and 2 being now obtained automatically, it is possible to use the adjustment properties of capacitors 11 and 13 for perfecting this tuning as a function of the reactive load presented by a body introduced between the two antenna semi elements 1 and 2. What is remarkable is that under these conditions it is possible to couple capacitors 11 and 12 mechanically so as to adjust them at the same time, identical adjustable capacitors 11 and 13 are chosen: they are for example capacitors in which opposite electrodes are moved with respect to each other. These capacitors are adjusted to an identical adjustment point. The identical starting value of capacitors 11 and 13 is the one which allows the tuning of the antenna in a vacuum to be adjusted in conjunction with the line 16-15. This identity of the starting values does not need to be very precise because of the presence of the lines 16-17. Then the operating wheels of the capacitors are connected together by mechanical means respectively 21 and 22 which are connected to a common control knob 23. By operating knob 23, this latter simultaneously drives the two mechanical means 21 and 22. The adjustment of capacitors 11 and 13 is modified simultaneously thereby by an identical value. This adapts the initial tuning provided to the present load. As a variant, adjustment of capacitors 11 and 13 may be replaced by adjustment of the length of the semi sections 16 and 17. Each of them in this case comprises, in series, a telescopic part. These telescopic parts may be driven in together so as to provide identical reactance modifications. Preferably, these telescopic parts are placed close to the junction of the two semi sections, where the electric field is low. For this, it may for example be sufficient to vary the length of the core of the coaxial cables inside the coupling box.

The magnetic coupling 20 comprises, in a coupling box not shown, a primary coupling loop 24 and a secondary coupling loop 25. The coupling box is for example made from copper for isolating the antenna from the parasite effects of this coupling. A loop 24 is disposed at the end of a high frequency coaxial supply cable 26. Loop 24 is formed by bending and connecting the core of cable 26 to the braiding of this cable at its end. In one example, the area of loop 24 is of the order of 15 cm$^2$ or so. The secondary loop 25 is formed by cutting the high frequency line 16–17 in two, while providing by a connection 27 the galvanic continuity of the braids of the coaxial cable semi sections 16 and 17 and connecting the cores of these sections to the ends of a loop 25 whose area is substantially equal to that of loop 24. The magnetic coupling of the power supply 26 to sections 16 and 17 is obtained by superimposing the two loops 24 and 25 (without contacting).

Mechanical means 28, comprising for example a screw 29 engaged in a threaded and fixed support 30, allow the coupling area 31 between the two loops 24 and 25 to be increased or reduced. Thus, the power transmitted or received may be matched. Finally, the impedance, seen from the cable 26, of the whole energization device may be adjusted: that is to say comprising the loops 24 and 25, the semi sections 16 and 17, the antenna semi elements 1 and 2 and especially the load formed by the body to be examined. Screw 29 therefore forms the second adjustment member which, like knob 23, has the advantage of simultaneously adjusting the two semi elements 1 and 2 of the antenna.

When tuning of the antenna is achieved by means of the control knob 23, the impedance seen at the middle 25–27 of the high frequency line 16–17 is purely resistive. The losses in the line 16–17 may be optimized by modifying the dielectric material, or the diameter of the core or of the braid of the coaxial cable used. At the position of loop 25, the corrected impedances are also purely resistive. But loop 24 itself provides a reactance. This reactance may be compensated for in two ways. In a first way, the antenna is untuned so as to cause an imaginary part to appear which compensates for this primary reactance. But in this case, the operating conditions are poor: antenna tuning is not obtained, and it may be difficult even impossible to provide power matching, for it would require too much mutual inductance for coupling. In a second way, a capacitor 32 calculated correspondingly is disposed in series in the primary loop 24. Thus, the resonance curve of the elements is used in the best way possible. This impedance matching is frozen. It only depends on the area of loop 24, it is independent of the mutual induction of these loops shown by surface 31. In other words, once this compensation by means or capacitor 32 has been obtained, the increase or reduction of surface 31 influences the matching of the power transmitted to or received from the antenna element 1–2.

But an antenna in general does not comprise a single antenna element 1–2. In a particular example it even comprises two: an additional antenna element 33–34 is added. Element 1–2 is contained in a section which intersects the fictitious cylinder 9 substantially like a diameter 15 of a circular section of this cylinder.

Preferably, element 33–34 is also contained in a section which intersects the cylinder 9 substantially like a diameter of a circular section of this cylinder. In addition, these two sections are perpendicular to each other. In other words, groups of conductors 3–4–5 of the semi element 1, 35–36–37 of the semi element 34, 6–7–8 of the semi element 2 and 38–39–40 of the semi element 33 are spaced apart about the periphery of cylinder 9. They are separated from each other by cylindrical sectors whose opening angle is substantially less than 90°. The antenna element 33–34 is fed in the same way as element 1–2. Its power supply comprises in particular two high frequency line semi sections 41 and 42, each of the length $\lambda/4$, for allowing frequency tuning. Magnetic coupling means 43, identical to means 20, provides the power supply for this antenna element.

The antenna of the invention has a feature related to the disymmetry of the bodies examined. This feature is shown in FIG. 2. In this Figure can be seen a body 44 whose section 45, taken in a plane perpendicular to the conductors, is rather elliptic. The ellipse 45 has then a large axis H and a small axis V. If body 44 is a human body, it represents substantially a patient lying on his back, or on his stomach, above a patient-carrying panel 46. With this panel the patient can be introduced inside the antenna. Because of the disymmetry of this patient, the real and imaginary loads presented by him to the field created by each of the antenna elements, may be different. Consequently, it would be necessary to adjust the coupling means 20 and 43 differently so as to take these differences into account. In particular, means 47 for adjusting the coupling means 43 would be operated differently from the means 28 for adjusting coupling 20. In fact, it is necessary to transmit substantially more energy for an oscillating field extending along axis H than along axis V. For the same reasons, the reactance presented by body 44 in the orientation H is different from the reactance presented along V. Consequently, it is necessary to adjust the frequency tuning of each antenna element differently so as to take this disymmetry into account. In other words, for each new patient introduced into the apparatus, it would be necessary to make four adjustments.

A feature of the invention simplifies the adjustments: the frequency and power tuning adjustments. In fact, it has been discovered that by slanting the sections containing the conductor element by 45° with respect to the small axis V of the ellipse, the result was obtained depending on whether each oscillating field created by an antenna element met a diagonal A-B or C-B of the section 45. These diagonals are of equal length. This would not be the case for medians parallel to the axes of the ellipse (the median parallel to the small axis would be smaller than the median parallel to the large axis). Therefore, the load presented by body 44 is seen in the same way by the two antenna elements. This discovery has been used for adjusting together the tuning capacitors 11–13 and 48–49 of all the semi elements.

Once the balance in a vacuum has been obtained (that is to say once the adjustment has been made in the factory) the antenna comprising these two elements may be matched in a single operation. A single control knob 23 is rotated which adjusts simultaneously the four capacitors. In one example, the four capacitors are mounted between the casing 10 and the ends of the conductors of the semi element 1 and 2 and 33 and 34. These conducting semi elements are spaced apart at the periphery of the fictitious cylinder 9 in the extension respectively of the diagonal C-D and A-B of the elliptic section 45. In the assembly, the wheels 81 to 84 for adjusting these capacitors may serve as guide pinion for an endless belt or chain 50. Chain 50 may also pass moreover over auxiliary bearings 51 to 54 fixed to casing 10. Bearing 54 even comprises a toothed wheel which meshes with chain 50. By rotating the control knob 23 this latter drives, by its shaft 55, the toothed wheel 54 which in its turn drives the chain 50. When passing, this chain engages the control wheels of the adjustable capacities so as to impart to all of them the same rotational movement. The modifications of the adjustable capacitors which result therefrom are therefore identical. Because of the presence of the auxiliary bearings, the chain segments do not obstruct the passage inside the antenna. Chain 50 is made from an amagnetic material.

The coupling means 20 and 43 may present a particular characteristic. The coupling loops 24 and 25 of coupling 20 may be orthogonal to the coupling loops of coupling 43. Thus, the magnetic field induced in coupling 20 cannot interfere with the magnetic field induced in coupling 43. Preferably, each coupling is contained in its own coupling box: it is isolated from the other coupling and is isolated from the antenna. Because of the slant of the two antenna elements with respect to the small axis V, the power adjustment of these two antenna elements may be achieved simultaneously by mechanically connecting together, by any means 56, the means 28 and 47 for adjusting these couplings. The mechanical means 56 may be of the same kind as those which are used for varying the adjustable capacities.

Preferably, the two antenna elements of the antenna are fed in phase quadrature. A 3 dB coupler 57 receives an energization signal from a generator 58 and distributes it over a so called transmitted channel 59 and over a so called coupled channel 60 to coaxial supply cables respectively 61 and 56. Cable 61 is the cable which ends at coupling 43, cable 26 ending at coupling 20. With such a coupler 57, the wave which leaves its different outputs is in phase quadrature. Consequently, in the antenna each semi element, 1 or 2 or 33 or 34, has with respect to the adjacent semi elements a phase shift of 90°. The field which they produce together, which is a combination of two oscillating fields, is a rotating field. Provision is made for the direction of rotation of this rotating field to be in correspondance with the rotating field produced by the de-energization of the nuclei of the body after the high frequency energization. If the two elements are not fed in phase quadrature, the field produced is quite simply an oscillating field.

For adjusting the tuning of the antenna elements and the power transmitted to these elements, in accordance with the invention, the power supply voltage produced by generator 58 is compared in amplitude and in phase with the corresponding voltages developed in the antenna elements.

Where the matching is perfect, the emitted power is distributed equally in each of the two elements, there is no reflection, all the power delivered is consumed. Preferably, for carrying out the comparison in the rotating field variant, the fourth channel 62 of the 3 dB coupler 57 is used. When adjustment is obtained, the voltage at the output of this fourth channel is zero. This may be expressed in the following way. If we call $\rho_t$ and $\rho_c$ the complex reflection coefficient visible at the outputs respectively 59 and 60 of the transmitted and coupled channels of coupler 57, it may be written that the voltage on the input channel is equal to $1+(\rho_c-\rho_t)/2$.

Similarly, the voltage seen on the fourth channel 62 of the coupler is equal to $(\rho_c+\rho_t)/2j$ (where j is the complex number such that $j^2=-1$). If we assumed, as is the case now with the 45° slant, that the antenna elements are symmetrical, we may write $\rho_c=\rho_t=\rho$.

The standardized input voltage is then equal to 1, the voltage on the fourth channel being equal to $\rho/j$.

The energization signal is then taken from the input 65 of the coupler and from the fourth channel 62 of the coupler. The two signals taken are introduced into a multiplier 63. This multiplier is of a known type; it is for example a quadratic diode multiplier. It works out the products of the inputted signals. It ouputs a signal whose amplitude is measured in an indicator 64. Preferably, the length of the coaxial supply cables 26 and 61 is a multiple of the half wave length of the energization wave. Thus, it reflects at the outputs 59 and 60 of coupler 57 loads equal to the load seen by the coupling means 20 and 43. These loads or impedances are equivalent to the above mentioned reflection coefficients. The frequency de-tuning and the power mismatching are reflected then in a signal measurable at the output 62.

If the detuning and mismatching are such that the input channel 65 and the fourth channel 62 are almost in phase, that means that the loads reflected at the outputs of the transmitted and coupled channels 59 and 60 of the coupler are inductive. If these signals are in phase opposition, these loads are capacitive. Therefore, using the control knob 23, the adjustable tuning capacitor are adjusted to a position intermediate between two maxima of the multiplication signal delivered by the multiplier 63. In fact, when the signals fed into this multiplier are in phase or in phase opposition, their quadratic product is maximum. From the practical point of view, these maxima are very close to each other and define a range. When this adjustment is reached, it may be inferred that the impedances reflected in channels 59 and 60 are no longer inductive or capacitive but that they are simply resistive. The complex term of the reflection coefficient is cancelled out.

With this adjustment reached, we may pass to the next step. It consists in adjusting the transmitted power. The aim to be reached is that the signal delivered by the fourth channel of the coupler is zero. This means that the indicators 64 must show a zero signal: it indicates in fact the result of a multiplication. Therefore, after seeking the maximum of the indication of indicator 64 using the control button 23, this indication is then cancelled out by means of the control 56. The adjustment described up to now is simple to understand. It may be readily carried out for each new patient introduced into the antenna. It may even be made with reiteration of the procedure. The result is a qualitative improvement in the measuring results.

Whereas, for obtaining a circularly polarized rotating field, the equality of the lengths of the coaxial cable sections 26 and 61 is required, their equality to $\lambda/2$ is not required. It is however fully justified in the description of the comparison means used. In fact, if the lengths of these sections are not proportional to half the wave length, the impedances reflected at the outputs 59 and 60 of the coupler 57 are transformed by the length of the cables. Comparison is in this case theoretically possible but more complex to achieve. If sections 26 and 61 are not equal, the rotating field is polarized elliptically.

In one example, the semi elements comprise multipole parallel conductors for improving the homogeneity of the high frequency field. These are the conductors 3 to 8 and 35 to 40 described above. These conductors may receive another improvement for avoiding damping of the pseudo continuous magnetic field gradients. In fact, the continuous magnetic field gradients are not fields constant in time but variable fields. All things considered, and especially with respect to the duration of the energization pulse and to the measurement time, these frequencies are very slow. During a reception time window, these fields appear constant and produce the expected gradient effects. Nevertheless, they are variable. Therefore, the antenna constructed must not absorb them. A means has been discovered for avoiding such absorption. It consists in placing capacitors in series in the conductors of the semi elements. They are installed for example close to the galvanic couplings of the high frequency line semi sections 16 and 17 or 41 and 42, in each of the conductors. The capacitor 66 in conductor 38 of semi element 33 is one example. Their values are calculated so that they appear as open circuits with respect to the low frequency fields serving as magnetic field gradients. On the other hand, for the high frequency energization field, they are equivalent to short circuits and their presence in series in the conductors raises no problem.

All the adjustment means have been described up to now for an energization phase. These adjustments are the most useful for reception. They are in fact the same since, after energization, it is the same body 44 which emits the de-energization frequency radio signal to be measured. The apparatus measuring the nuclear magnetic resonance comprises then conventionally signal processing means for processing a signal delivered by the output (−input) 65 of the directive coupler 57. The whole antenna described with its supply circuits is in fact reversible and may operate for reception.

What is claimed is:

1. A high frequency antenna for an apparatus measuring the nuclear magnetic resonance of the nucleii of a body comprising:
   at least one antenna element formed of two conducting semi elements extending opposite each other along generatices of a fictitious cylinder;
   means for radiating a high frequency magnetic field inside the fictitious cylinder wherein said means for radiating comprise each one of said two conducting semi elements associated with an adjustable tuning capacitor and a cylindrical metal casing, wherein said means for radiating are respectively fed in phase opposition with respect to each other by a high frequency electrical signal, which antenna further copmrises a high frequency line section, whose length is substantially equal to half the wavelength of the high frequency wave corresponding to the signal, and which is connected by its ends to each of the conducting semi elements for frequency tuning the radiating means.

2. The antenna as claimed in claim 1, further includes a means for supplying said high frequency electrical signal to the conducting semi elements wherein said means for supplying comprises a primary magnetic coupling loop which radiate a magnetic field in a secondary magnetic coupling loop connected substantially the middle of the high frequency line section.

3. The antenna as claimed in claim 2, wherein said primary coupling loop comprises in series a capacitor for the impedance matching of the magnetic coupling.

4. The antenna as claimed in any one of claims 2 or 3, wherein said supply means comprise means for moving the loops with respect to each other so as to thus serve as means for adjusting the matching of the power transmitted to the antenna element.

5. The antenna as claimed in any one of claims 1 to 3, further comprising means for simultaneously adjusting the adjustable tuning capacitors and thus forming frequency tuning means for the antenna element.

6. The antenna as claimed in claim 5, wherein the means for adjusting the capacitors comprise a drive means made from a continuous amagnetic material bearing on wheels for adjusting the capacitors.

7. The antenna as claimed in any one of claims 1 to 3, wherein said high frequency line section comprises telescopic parts serving as means for the frequency tuning adjustment of the radiating means.

8. The antenna as claimed in any one of claims 1 to 3 comprising two antenna elements whose semi elements are disposed at the intersection of the fictitious cylinder and of two perpendicular sections symmetrical with each other with respect to a plane passing through a small axis of an elliptical section, said section being orthogonal to the generatrices of the cylinder, and representing substantially a section of the body when it is subjected to the examination.

9. The antenna as claimed in claim 8, wherein said supply means comprise means for supplying the antenna elements in phase quadrature from a single generator.

10. The antenna as claimed in claim 2, wherein said coupling loops are disposed in coupling boxes.

11. The antenna as claimed in claim 4, comprising means for comparing a supply voltage in phase and amplitude with corresponding voltages developed in the antenna elements and for acting consequently on the frequency tuning and power adjustment means respectively.

12. The antenna as claimed in claim 11, wherein said comparison means comprise, coupled together, high frequency line stubs of equal length from the quadrature supply means to the coupling loops.

13. The antenna as claimed in claim 12, wherein the length of said stubs are multiples of half the wave length of the high frequency wave.

14. The antenna as claimed in claim 13, wherein said comparison means comprise multiplication means for multiplying the delivered signals, through a fourth channel of the quadrature supply means, by the signal introduced at the input of a first channel of these quadrature supply means.

15. The antenna as claimed in any one of claims 1 to 3, wherein each semi element comprises multiple parallel conducting bars connected galvanically together at their ends for improving the homogeneity of the high frequency magnetic field radiated.

16. The antenna as claimed in any one of claims 1 to 3, wherein the conductors of the antenna semi elements each comprise in series a capacitor whose value is such that it is equivalent to a short circuit for the high energization frequency and to an open circuit for frequencies much lower than this high frequency.

17. A high frequency antenna for an apparatus measuring the nuclear magnetic resonance of the nucleii of a body comprising:
- at least one antenna element formed of two conducting semi elements extending opposite each other along generatrices of a fictitious cylinder;
- means for radiating a high frequency magnetic field inside the fictitious cylinder wherein said means for radiating comprise each one of said two conducting semi elements associated with an adjustable tuning capacitor and a cylindrical metal casing, wherein said means for radiating are respectively fed in phase opposition with respect to each other by a high frequency electrical signal, which antenna further comprises a high frequency line section, whose length is substantially equal to half the wavelength of the high frequency wave corresponding to the signal, and which is connected by its ends to each of the conducting semi elements for fequency tuning the radiating means;
- means for simultaneously adjusting the adjustable tuning capacitors and thus forming frequency tuning means for the antenna element; and
- means for comparing a supply voltage in phase and amplitude with corresponding voltages developed in the antenna elements and for acting consequently on the frequency tuning and power adjustment means respectively.

18. A high frequency antenna for an apparatus measuring the nuclear magnetic resonance of the nucleii of a body comprising:
- at least one antenna element formed of two conducting semi elements extending opposite each other along generatrices of a fictitious cylinder;
- means for radiating a high frequency magnetic field inside the fictitious cylinder wherein said means for radiating comprise each one of said two conducting semi elements associated with an adjustable tuning capacitor and a cylindrical metal casing, wherein said means for radiating are respectively fed in phase opposition with respect to each other by a high frequency electrical signal, which antenna further comprises a high frequency line section, whose length is substantially equal to half the wavelength of the high frequency wave corresponding to the signal, and which is connected by its ends to each of the conducting semi elements for fequency tuning the radiating means;
- two and which is connected by its ends to each of the conducting semi elements for fequency tuning the radiating means;
- two antenna elements whose semi-elements are disposed at the intersection of the fictitious cylinder and of two perpendicular sections symmetrical with each other with respect to a plane passing through a small axis of an elliptical section, such section being orthogonal to the generatrices of the cylinder, and representing substantially a section of the body which is subjected to a examination; and
- means for comparing a supply voltage in phase and amplitude with corresponding voltages developed in the antenna elements and for acting consequently on the frequency tuning and power adjustment means respectively.

* * * * *